United States Patent [19]

Gruen

[11] Patent Number: 5,015,493
[45] Date of Patent: May 14, 1991

[54] PROCESS AND APPARATUS FOR COATING CONDUCTING PIECES USING A PULSED GLOW DISCHARGE

[76] Inventor: Reinar Gruen, Wohlfahrtstr, 166, 4630 Bochuml, Fed. Rep. of Germany

[21] Appl. No.: 142,542

[22] Filed: Jan. 11, 1988

[30] Foreign Application Priority Data

Jan. 11, 1987 [DE] Fed. Rep. of Germany ....... 3700633

[51] Int. Cl.$^5$ ............... B05D 5/12; C23C 14/22; C23C 14/28; C23C 14/30
[52] U.S. Cl. ........................... 427/38; 427/39; 427/37; 427/47; 204/192.31
[58] Field of Search ............ 204/192.31, 192.12, 204/192.15; 427/39, 38, 37, 47

[56] References Cited

U.S. PATENT DOCUMENTS

| | | | |
|---|---|---|---|
| 3,282,814 | 11/1966 | Berghaus | 204/192.12 |
| 3,464,907 | 9/1969 | Froemel et al. | 204/192.12 |
| 3,677,799 | 7/1972 | Hou | 427/38 |
| 4,082,636 | 4/1978 | Takagi | 204/192.31 |
| 4,401,539 | 8/1983 | Abe et al. | 204/298 |
| 4,490,190 | 12/1984 | Speri | 204/192.31 |
| 4,492,845 | 1/1985 | Kljucho | 427/34 |
| 4,609,564 | 9/1986 | Pinkhasov | 427/37 |
| 4,692,230 | 9/1987 | Nihei et al. | 204/298 |
| 4,724,058 | 2/1988 | Morrison, Jr. | 427/37 |

FOREIGN PATENT DOCUMENTS

| | | |
|---|---|---|
| 58-017607 | 2/1983 | Japan. |
| 0039524 | 9/1983 | Japan. |
| 59-019327 | 1/1984 | Japan. |
| 61-261473 | 11/1986 | Japan. |

OTHER PUBLICATIONS

T. Spalvins, "Plasma Assisted Surface Coating/Modification Processes: An Emerging Technology", from the International Conference on Ion Nitriding, Cleveland, Ohio, Sep. 15–17, 1986, pp. 1–8.
T. Bell et al., "Plasma Surface Engineering", from the International Seminar on Plasma Heat Treatment Science and Technology, Sep. 21–23, 1987, pp. 13–53.

Primary Examiner—Norman Morgenstern
Assistant Examiner—Margaret Bueker
Attorney, Agent, or Firm—Hill, Van Santen, Steadman & Simpson

[57] ABSTRACT

A process and apparatus for coating conductive workpieces by ionized vapors with the assistance of a glow discharge includes providing a periodically pulsed input of energy for the discharge so that stress on the parts is reduced and a smooth coating results. Either a constant or periodic magnetic field is superimposed to influence the coating process for better results and better handling.

9 Claims, 3 Drawing Sheets

PROCESS AND APPARATUS FOR COATING CONDUCTING PIECES USING A PULSED GLOW DISCHARGE

BACKGROUND OF THE INVENTION

Field of the Invention

The present invention relates generally to a process for coating conductive workpieces and for an apparatus using this process.

Description of the Related Art

Processes are known for coating workpieces in which the coating material is deposited from a vapor onto the workpiece. To reduce the strain on the workpiece caused by high temperatures occuring during the coating process, the coating material is evaporated in a vacuum within a vessel by different physical methods. These are the so called PVD (physical vapor deposition) processes. Different methods for creating the vapor from a target or coating supply are: sputtering (such as by ion bombardment), arcing, electron beams, etc. By applying a high voltage, a plasma can be created containing ions of the vapor. These ions are handled by electric and magnetic fields to get special coatings on the workpieces. Using such electrical and magnetic fields can increase the deposition rate.

Coating processes using a plasma create an undesirable high temperature in the workpiece and in the coating, since the kinetic energy of the ions in the plasma is absorbed at the respective surfaces. The high kinetic energy also results in removal of at least some of the deposited coating. Normally, a high deposition rate at a low temperature for the workpiece is desired so that the above-mentioned properties are supressed.

In the known devices, a plasma is created by electric discharge. The electric discharges are ignited between two electrodes; the evaporated material in the vessel between the electrodes being ionized so that an electric current passes through the plasma. The electric current supports the plasma; but on the other hand, the energy input into the plasma by the current leads to high temperatures both in the electrodes and within the vessel. Therefore, the chamber walls of the vessel, as well as the workpieces, generally have to be cooled. Pieces to be treated which have a high surface-to-volume ratio can easily become overheated by the ion bombardment of the plasma. The consequence of such over heating is a high rate of damaged parts in a batch of workpieces. Alternately, it becomes necessary to put only similar parts into each load. A further problem in the known processes is that a high temperature gradiant occurs between the work load or batch and the cooled chamber walls, which results in deposition conditions which are very different for each part. Therefore, the coating is unequal on different workpieces within the vessel.

SUMMARY OF THE INVENTION

An object of the invention is to avoid the disadvantages of the known process and provide a new process for coating workpieces using ionized vapors, the new process having advantages of lower operating costs, lower waste, better quality, and improved process conditions. This and other objects are achieved by using periodic impulses of electric power input to the plasma. This enables very careful coating of the pieces, because the pieces will not be heated up to high temperatures by the input of plasma energy. At the same time, the operating costs and the waste are reduced.

It has been found that the voltage impulses should have an amplitude of more than 100 volts, and, particularly, an amplitude of between 200 and 800 volts, inclusive. Such voltage pulses are created and maintained in a plasma in which the development of arcs is precluded and, on the other hand, a good coating of workpieces is possible. With the aim of such pulses, it is possible to coat surface structures of pieces having slots and bores in which the ratio in diameter-to-depth is less than 1.

It has further been found that the pulses should have a current density through the plasma onto the workpiece of between 0.1 $mA/cm^2$ to 1 $A/cm^2$ and, in particular, 0.5 $mA/cm^2$. Such current densities lead to very good growth conditions of the coating at a very low energy input. The power density of the pulses of the invention have values of between 1 $W/cm^2$ and 900 $W/cm^2$, and, in particular 30 $W/cm^2$. The duration of the pulses may be adjusted within a range of from 10–10,000 microseconds and, preferably, in a range of 30 through 200 microseconds. It has been found that these regions provide a secure and economic coating process.

According to the invention, the average value of the plasma power density onto the workpiece surface may be used in a range of between 50 $mW/cm^2$ and 5 $W/cm^2$. This very wide range has the advantage of preventing strain on the surface of the workpiece and the coating by ion bombardment, and, as such, preventing undesired heating thereof. On the other hand, it is still possible to use the electric parameters which are necessary for generation of a stable plasma glow discharge. Therefore, it is possible to coat pieces having very different geometries.

The coating process of the present invention uses a vacuum pressure of less than 100 Pascal (Pa.), and in particular in a range of between 0.1 and 1 Pascal. It is also possible, however, to realize the present process at higher vacuum pressures.

In a further development of the present invention, a magnetic field is superimposed on the plasma. Particular advantages are realized when the magnetic field has an impulse characteristic. By providing a pulsed magnetic field, the ions in the plasma are influenced so that the coating is uniform even on complicated surfaces of a workpiece.

In yet another development, an auxiliary heating means is used to favor desirable chemical reactions and/or diffusion. By such auxiliary heating, it is also possible to control the temperature in the vacuum chamber very well without changing the plasma parameters.

The invention is especially useful for PVD processes, like ion plating or sputtering, and for target evaporation by an arc or electron beam or other means.

To prevent the formation of arcs onto the workpiece, the process, in one embodiment, is interrupted by cutting the current for the plasma maintenance after less than 100 microseconds. Damage by arcing to the coated surface is, therefore, not possible in this embodiment.

BRIEF DESCRIPTION OF THE DRAWINGS

FIG. 6B is a graph of the work load of the known process compared to the work load of the present process corresponding to the diagram of FIG. 6a.

DESCRIPTION OF THE PREFERRED EMBODIMENTS

Figure 1:
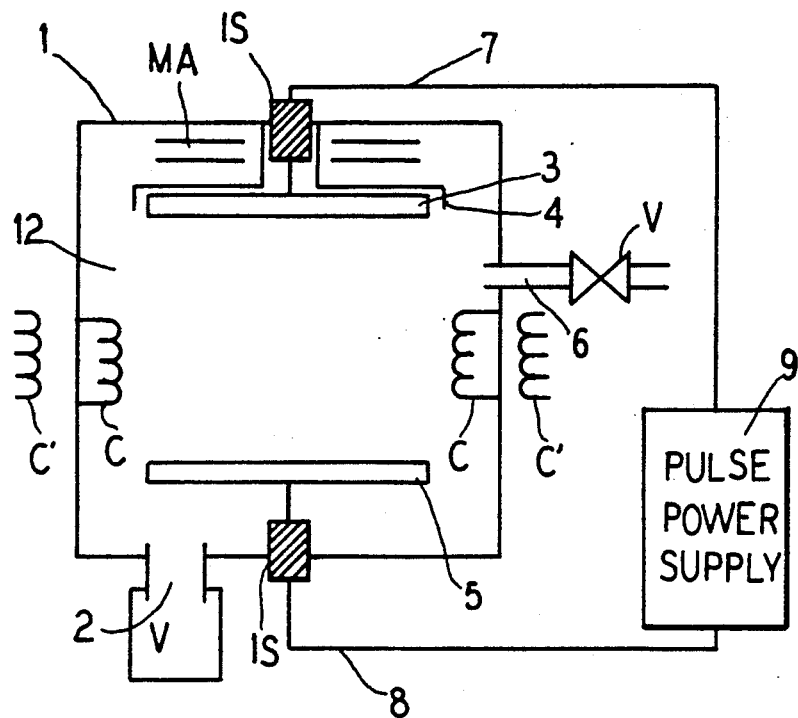
FIG. 1 is a schemmatic diagram of an apparatus for sputtering according to the principles of the present invention.

In FIG. 1, a schematic diagram of a coating process using sputtering is shown. The coating process is performed in a vacuum chamber or vessel 1 which is connected to a vacuum pump VP by a tube 2 for evacuation of the chamber 1. A target surface 3 of a coating material is sputtered by ion bombardment with ions in a plasma 12 within the vacuum chamber 1. The target 3 is cathodic so that only positive ions are accelerated toward the target. The power density within the vessel 1 is approximately 3 W/cm$^2$, and the pressure in the vessel 1 is at some low pressure, which may be less than 100 Pa. A plasma forming gas is supplied into the interior of the chamber 1 through a connection 6 which includes a valve V. A shield 4 is provided behind the target surface 3 and, as illustrated, is connected to the wall of the vacuum chamber 1 encircling an insulator sleeve IS. To accelerate ions in the plasma 12 to the target 3, a DC voltage is connected between leads 7 and 8. The DC voltage is generated by a pulse power supply 9. The leads 7 and 8 extend through the chamber walls through the insulator sleeves IS, which also seal the chamber 1. The anodic lead 8 is connected through the insulator sleeve IS to a workpiece 5 upon which the coating material sputtered from the target 3 accummulates.

Figure 2:
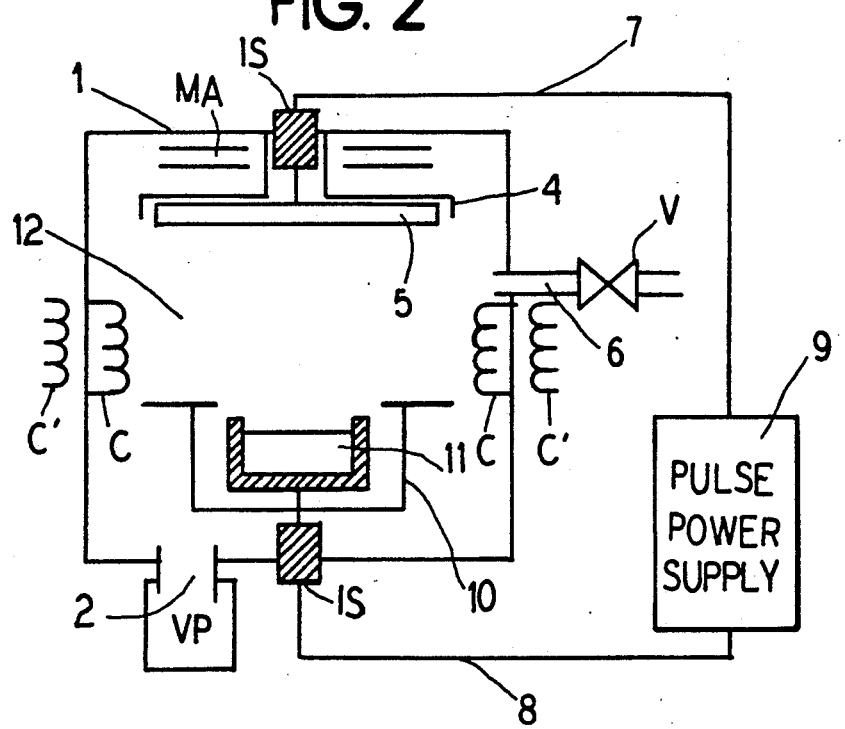
FIG. 2 is a schemmatic diagram of an appartus for ion plating according to the principles of the invention.

In FIG. 2, is shown the use of the inventive process for ion plating. Equivalent parts of the apparatus in FIG. 2 are numbered with the same reference numerals as the corresponding parts in FIG. 1. For ion plating, the workpiece 5 is cathodic relative to an anodic evaporation source 11 of coating material. A glow discharge plasma 12 is formed between an anode 10 and the workpiece 5 by voltages generated by the pulse power supply 9. The distance between the vapor source or evaporation source 11 and the workpiece 5 is between about 20 to 5.0 cm. The workpiece 5 has a negative potential of between 100 to 1000 volts relative to the vapor source 11. The current density within the vacuum chamber 1 is approximately 0.5 mA/cm$^2$ at a low gas pressure which may be below 100 Pa. The ions in the plasma 12 are scattered so that even complicated geometries of the workpiece 5 are coated uniformly.

Figure 3:
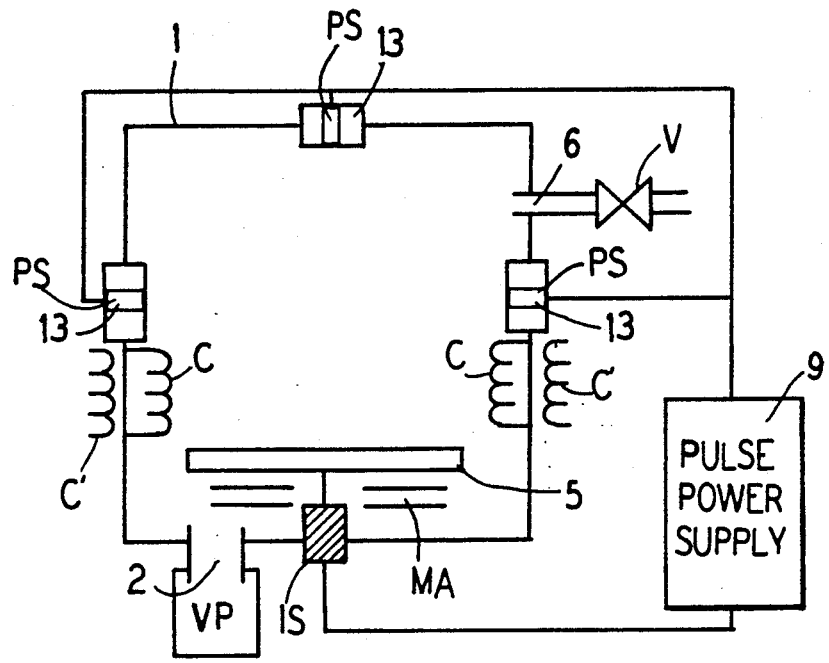
FIG. 3 is a schemmatic diagram of an apparatus for arc evaporation according to the invention.

A variation of ion plating is shown in FIG. 3. Evaporation of a target 13 is done by an electric arc. It is possible to use one or more vapor sources or targets 13 in one vacuum vessel 1, the illustrated embodiment having three such sources 13. To form and maintain an arc for evaporation of the target 13, a separate power supply PS is provided for each of the targets 13 so that arcs are generated at each of the targets 13. The targets 13 are cathodic, so that positive ions in the gas with high energies will bombard their surfaces. Such an arc has a current of between about 60 to 400 amps and a voltage of between about 20 to 60 volts. The base of the arc runs over the surface of the targets 13 and creates local overheating so that the target material evaporates. The ionization rate of a vapor thus formed is about 90% and most of the particles have a high kinetic energy of more than 10 ev. Such ions are accelerated to the workpiece 5 due to the negative potential relative to the vapor source 13. The pulse power source 9 provides this accelerating voltage so that the coating process is considerably improved.

The plasma density near the source of a sputtering process can be improved with the aid of a magnetic field. The magnetic field is created in the vessel 1 by a magnetron MA behind the target 3 so that the magnet field is vertical to the electric field. From the other side, a better coating is possible by using a superimposed magnetic field near the workpiece in FIGS. 1, 2, and 3 especially when this field is parallel to the electric field. Such a magnetic field can be produced, for example by coils C as shown inside the chamber 1 or by coils C′ shown outside chamber 1. Although the coild C and C′ are shown schematically at limited locations in the Figures, such coils C, when used, actually extend completely around the inside of the vessel 1 and the coils C′, when used, encircle the outside of the vessel 1. The improved coating is possible by a special arrangement of an electric and magnetic field near the workpiece 5. Better control of the coating process is available when the power supplies to both the electric and magnetic fields are pulsed.

Figure 4:
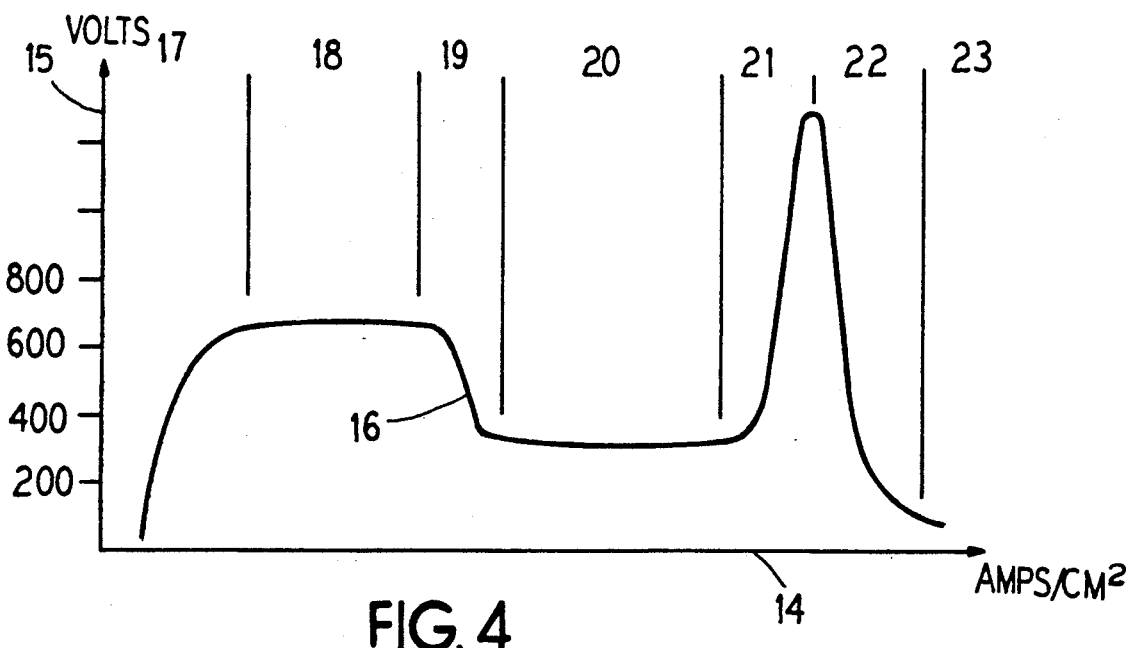
FIG. 4 is a voltage to current graph of a glow discharge as used in the invention.

For all processes discussed in conjunction with FIGS. 1 through 3, a plasma glow discharge is used. The voltage to current characteristic of a glow discharge is shown in FIG. 4. Current density is indicated on an abscissa 14, while voltage is indicated along an ordinate 15. A graph curve 16 is separated into seven different portions numbered 17 through 23. An abnormal glow discharge occurs along portion 21 of the graph, which is used in the present process.

In the region 20 just before the abnormal glow discharge 21 occurs a normal glow discharge, while an arc discharge occurs in the region 23 on the otherside thereof. Due to the high voltage and high current density, the energy flow is very strong.

A plasma maintaining current results in positive ions moving toward the negative cathode and electrons moving the opposite direction. The resulting current strains the workpieces 5 to be coated. To maintain the plasma, a minimum voltage is necessary. Therefore, the ions have a minimum acceleration so that new coating material on the workpiece will be partly sputtered by using the known process.

Figure 5:
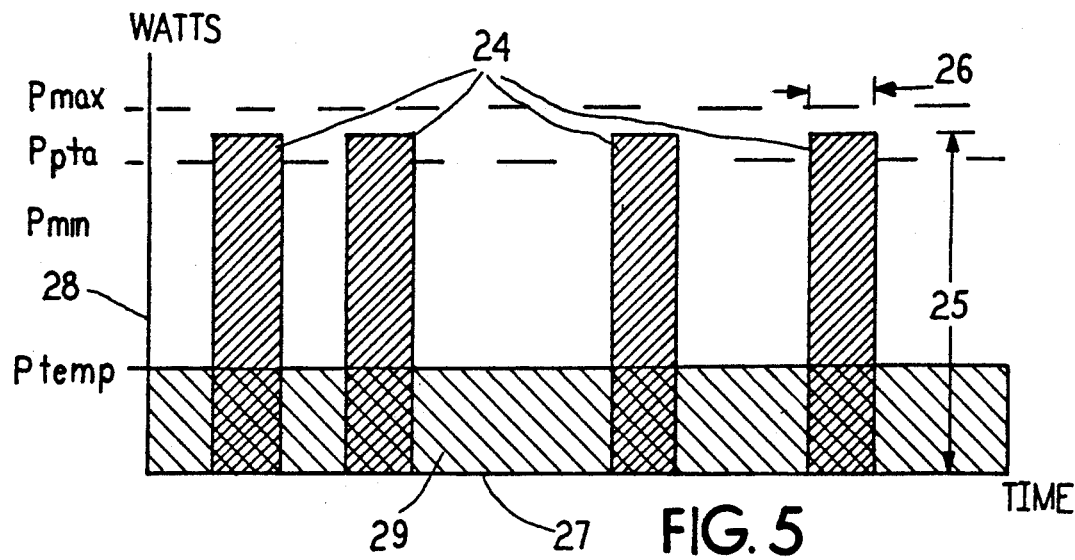
FIG. 5 is a power graph in the work load of a DC plasma process.

Against this, FIG. 5 shows a power characteristic or graph of a plasma to which is applied periodic impulses for the present careful coating process. The power characteristic shown maintains the physical conditions necessary in the chamber 1 for an abnormal glow discharge.

The temperature stress of the substrate is held very low or can be controlled within special limits. In the vacuum vessel 1, a uniform temperature distribution is possible and the development of undesired arcs is considerably reduced.

The region 21 of the abnormal glow discharge is very small and is reduced by increased pressure in the vessel 1. Therefore, the coating of workpieces 5 with mutually different shapes that are together in one coating cycle or batch is very difficult. The risk of over heating is very high, especially for small pieces with a high surface-to-volume ratio. On the other hand, the plasma power input cannot be reduced by any amount, since this will extinguish the glow discharge.

The power input in the plasma is pulsed by the power supply 9. In FIG. 5, each pulse 24 has a maximum value 25 which fulfills the physical conditions necessary for an abnormal glow discharge (region 21 of FIG. 4). In FIG. 5, an abscissa 27 is representative of time, while an ordinate 28 indicates the power input, such as in watts. Normally, a pulse duration 26 of each voltage pulse lies in the region of 10-100 microseconds. The power input to each pulse 24 can vary between a minimum power $P_{min}$ and a maximum power $P_{max}$. The limits $P_{min}$ and $P_{max}$ correspond to the limits of the abnormal glow discharge region 21 of FIG. 4. The value for the power $P_{Temp}$ is equivalent to the power that is necessary for a certain temperature in the chamber 1 to balance the energy losses.

An energy input represented by the shaded area 29 is equivelant to the sum of the areas of the pulses 24. The equivalent area 29 represents a much lower energy relative to the input level of a DC power supply necessary to maintain a glow discharge. By variation of the pulse-to-pause duration, the total energy input 29 can be varied in a very wide range. As shown, the pauses between pulses 24 can vary. The minimum energy input is not used for the maintenance of the glow discharge, but to realize a uniform energy temperature distribution in the chamber 1.

An ideal pulse contour for the power input is a square, as shown in FIG. 5. This means that the power increase and decreases should be as fast as possible, for example faster than one microsecond. The pulse duration is usually less than 100 microseconds. The pause duration after each pulse is usually within the range of 100-1000 microseconds. With these values, the risk of an arc formation is very low, yet the glow ignition after each pulse is guaranteed.

Figure 6A:
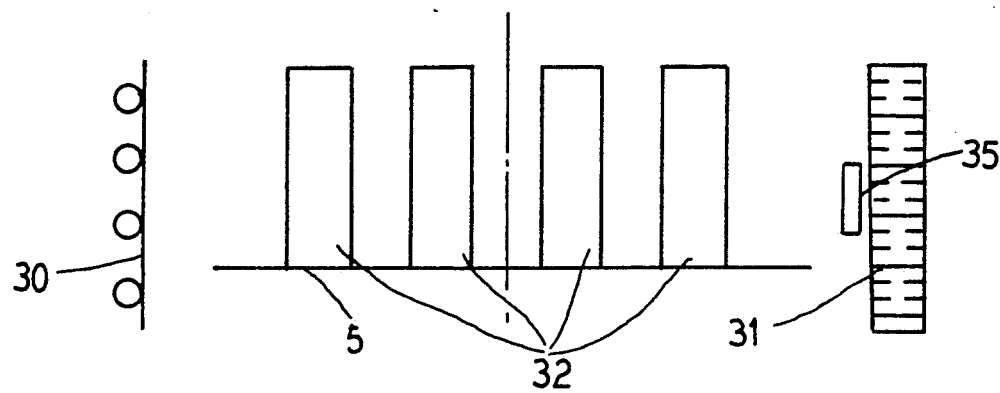
FIG. 6A is a schemmatic drawing of a known process in comparison to the process of the present invention.

The ratio between the pulse and pause duration may be varied in a very wide range so that wall cooling of the chamber 1 is not necessary. In addition, it is possible to use an auxiliary heating means 35 as shown in FIG. 6A for the workload so that better temperature uniformity results. Such auxiliary heating means 35 can also promote some reactions.

Figure 6B:
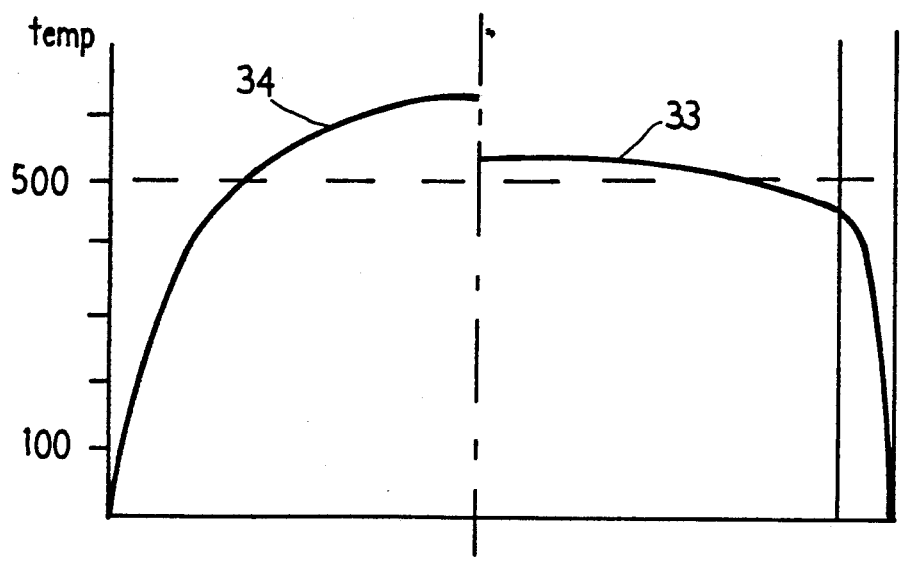

Referring to FIG. 6A, a partial schemmatic of two work chambers with a work load is shown. To the left side is a cooled wall chamber 30 with cooling elements on the outside surface, while on the right side is a hot wall 31 from a chamber 1 of the present invention provided with insulation. Different individual workpieces 32 to be coated are positioned on a support 5 within the two chambers chamber. The hot wall 31 of the illustrated embodiment has the heating means 35 internal of the wall. As can be seen in FIG. 6B, different temperature profiles are formed which differ depending on the type of chamber walls provided. In FIG. 6B, the graph of the temperature profile in a hot wall chamber 31 is shown by line 33, and that of a cold wall chamber 30 is shown at 34. Much better temperature uniformity in the work load is provided by the hot wall chamber 31 since the temperature drop off from the work load to room temperature occurs within the insulation of the wall 31. Therefore, hot wall chamber 31 are preferred in the present invention.

Therefore, the coating treatment with the inventive process leads to much lower waste and the working expenses are lower. The coating rate is higher and the uniformity of the coating over the whole work load is better because the strain induced by sputtering is lower.

The auxiliary heating 35 mentioned above can be positioned on the inside or on the outside of the vacuum vessel in alternate embodiments.

Although other modifications and changes may be suggested by those skilled in the art, it is the intention of the inventor to embody within the patent warranted hereon all changes and modifications as reasonably and properly come within the scope of his contribution to the art.

I claim:

1. A PVD coating process for covering conductive pieces, comprising:
    using an ionized vapor with reactive gases in a vacuum vessel;
    establishing a pressure of less than 100 Pascal in said vacuum vessel;
    connecting a conductive piece to a cathode connection of a pulsed DC energy supply;
    establishing a glow discharge around the conductive pieces by using the pulsed DC energy supply connected directly between a source and the conductive pieces; and
    applying DC pulses in a square wave form from said pulsed DC energy supply at a repetition frequency in a range of 0.1-100 kiloHertz and at a pulse to non-pulse ration in a range of 1:1-1:1000, each pulse of the pulsed DC energy supply having an amplitude of at least 100 volts and a duration of between 10 and 10,000 microseconds.

2. A PVD coating process as claimed in claim 1, wherein said pulsed DC energy supply has a DC voltage of between 200 volts and 800 volts, inclusive.

3. A PVD coating process as claimed in claim 1, wherein each pulse of said pulsed DC energy supply has a current density of between 0.1 mA/cm$^2$ and 1 A/cm$^2$ inclusive and an energy density of between 1 W/cm$^2$ and 900 W/cm$^2$.

4. A PVD coating process for covering conductive pieces, comprising:
    using an ionized vapor with reactive gases in a vacuum vessel;
    connecting a conductive piece to a cathode connection of a pulsed DC energy supply;
    establishing a glow discharge around the conductive pieces by using the pulsed DC energy supply connected directly between a source and the conductive pieces, each pulse of the pulsed DC energy supply having a duration of between 10 and 10,000 microseconds; and
    superimposing a magnetic field on said glow discharge.

5. A PVD coating process as claimed in claim 4, further comprising:
    pulsing said superimposed magnetic field.

6. A PVD coating process as claimed in claim 1, further comprising:
    providing auxiliary heat as a separate energy input.

7. A method for coating a conductive workpiece, comprising the steps of:
    providing a partial vacuum in a vacuum vessel containing the conductive workpiece;
    vaporizing coating material from a source of coating material within the vacuum vessel;
    generating a plasma within the vacuum vessel;

applying periodic voltage pulses between the source and the conductive workpiece, the voltage pulses being repeated every 10 to 10,000 microseconds and having a duration of no more than 100 microseconds; and applying a magnetic field to the plasma.

8. A method as claimed in claim 7, further comprising the step of:

pulsing the magnetic field.

9. A method as claimed in claim 7, wherein said step of applying a magnetic field comprises:

applying the magnetic field parallel to an electric field generated by the voltage pulses at least near the conductive workpiece.

* * * * *